United States Patent
Chang

(10) Patent No.: US 6,466,470 B1
(45) Date of Patent: Oct. 15, 2002

(54) CIRCUITRY AND METHOD FOR RESETTING MEMORY WITHOUT A WRITE CYCLE

(75) Inventor: Houn Chang, San Jose, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 09/706,314

(22) Filed: Nov. 4, 2000

(51) Int. Cl.$^7$ .............................................. G11C 15/00
(52) U.S. Cl. ........................ 365/49; 365/154; 365/156
(58) Field of Search .................... 365/49, 154, 156, 365/149, 129

(56) References Cited

U.S. PATENT DOCUMENTS

| | | | | | |
|---|---|---|---|---|---|
| 627,788 | A | * | 6/1899 | Chang | 366/238 |
| 5,226,009 | A | * | 7/1993 | Arimoto | 365/189.04 |
| 5,325,325 | A | * | 6/1994 | Azuma | 365/156 |
| 5,790,461 | A | * | 8/1998 | Holst | 365/189.04 |
| 5,894,432 | A | * | 4/1999 | Lotfi | 365/154 |
| 5,999,478 | A | * | 12/1999 | Proebsting | 365/230.05 |
| 6,108,233 | A | * | 8/2000 | Lee et al. | 365/154 |
| 6,122,707 | A | | 9/2000 | Schultz et al. | 711/108 |
| 6,128,207 | A | | 10/2000 | Lien et al. | 365/49 |

FOREIGN PATENT DOCUMENTS

JP 363014339 * 1/1988
JP 401290194 * 11/1989

OTHER PUBLICATIONS

Content Addressable Memory Structures, IBM Technique Disclosure Bulletin, Mar. 1989 US, vol. 31, pp. 461–466.*

* cited by examiner

Primary Examiner—Hoai Ho
(74) Attorney, Agent, or Firm—Danamraj & Youst, P.C.

(57) ABSTRACT

Circuitry and associated method for resetting a memory storage cell without a dedicated write cycle therefor. Preferably, the storage cell is provided as part of an age__array employed for monitoring the usage of a Content Addressable Memory (CAM). When a match between search data and contents of a particular location of the CAM is found, a Match signal is generated to set a memory storage cell (referred to as an age__cell) corresponding to the particular CAM location. When the age__array is read, the wordline associated with the age__cell is driven high. Upon developing a voltage separation between the data and data bar nodes of the age__cell, a sense amp senses the data value on the corresponding bit and bit bar lines coupled thereto. A suitable data out signal is generated for outputting the sensed data. Also, a reset control signal is generated to indicate that the read operation is substantially complete with respect to that age__cell. The reset control signal is applied to the age__cell to drive its data node to ground in order to store a binary 0 thereat. Accordingly, dedicated write cycles to reset the age__array for further monitoring of the CAM usage after the read cycles are no longer required.

27 Claims, 5 Drawing Sheets

CIRCUITRY AND METHOD FOR RESETTING MEMORY WITHOUT A WRITE CYCLE

BACKGROUND OF THE INVENTION

1. Technical Field of the Invention

The present invention relates generally to semiconductor memories, and more particularly, to a memory array where memory cells can be reset without a write cycle following a read cycle.

2. Description of Related Art

It is well known that memory performance and usage is a key component in optimizing electronic systems that require memory. Such systems often demand efficient use of memory by minimizing access time, reducing the number of memory cycles (i.e., read/write cycles) and/or power consumption, etc. These factors become more significant where expensive memory with special functionality is required for certain system-level applications such as telecommunications equipment (e.g., routers having network processors), address translators for Asynchronous Transfer Mode (ATM) address mapping, table look-up and mapping applications, et cetera. In order to improve the system performance and save silicon area in such applications, it is incumbent upon hardware designers to strive for solutions that reduce memory cycles.

Content Addressable Memory (CAM) is a specialized memory that is widely used in network equipment applications. CAM cells are memory cells that are addressed in response to their content, rather than by a physical address within the array. Once the CAM array is initialized with data entries, the entire CAM can be searched in a single operation. To determine if a data value is still stored in the CAM array, a compare operation is performed by the CAM cells. To better manage the CAM usage, results of the compare operation are typically used in conjunction with another associative memory that is periodically read for determining CAM usage. As part of its monitoring function, the associative memory is required to be reset to zero in order to be able to detect if one or more corresponding CAM cells are available for new data entry.

Those skilled in the art should appreciate that resetting the associative memory (or any random access memory, for that matter) typically involves effectuating write cycles for storing binary 0's in selected cell locations and such write cycles expend time that might be otherwise used more beneficially. Further, reducing or eliminating the write cycles also optimizes the overall performance of a system, for example, the CAM memory usage management exemplified hereinabove.

SUMMARY OF THE INVENTION

Accordingly, the present invention advantageously provides circuitry and associated method for resetting a memory storage cell without a dedicated write cycle therefor. Preferably, the storage cell is provided as part of an age_array employed for monitoring the usage of a Content Addressable Memory (CAM). When a match between search data and contents of a particular location of the CAM is found, a Match signal is generated to set a memory storage cell of the age_array (referred to as an age_cell) corresponding to the particular CAM location. When the age_array is read, the wordline (WL) associated with the age_cell is driven high. Upon developing a voltage separation between the data and data bar nodes of the age_cell, a sense amp senses the data value on the corresponding bit (BT) and bit bar (BB) lines coupled thereto. A suitable data out signal is generated for outputting the sensed data. A control signal (hereinafter referred to as reset control signal) is generated to indicate that the data sense operation is substantially complete with respect to that age_cell. The reset control signal is applied during the read cycle to the age_cell to drive the data node thereof to ground in order to store a binary 0 thereat. Furthermore, the control signal is also provided to the age_array control block in order to deactivate the selected WL. Accordingly, the need for dedicated write cycles to reset the age_array for further monitoring of the CAM usage after the read cycles is advantageously obviated.

In a presently preferred exemplary embodiment, the reset circuitry provided with the age_cells comprises two NMOS transistors wherein one transistor (data discharge transistor) is coupled to the data node of the age_cell and the other transistor (pull-down transistor) is coupled thereto and ground. The reset control signal is applied to the gate of the pull-down transistor and the selected WL is applied to the gate of the data discharge transistor.

In a further aspect, the present invention is directed to semiconductor memory circuit which comprises a plurality of storage cells, each having a data node and a data bar node; and circuitry coupled to at least one storage cell for discharging the data node associated therewith during a read cycle with respect to the storage cell being accessed.

In yet further aspect, the present invention is directed to a memory system which comprises a CAM block including a plurality of locations operable to store a plurality of contents and an age_array operably associated with the CAM block for monitoring the plurality of locations to determine whether a particular location of the CAM block is available for storing new content data thereat. The age_array preferably comprises a plurality of age_cells organized as an N-by-1 array, wherein each age_cell corresponds to a specific location in the CAM block. An age_cell is set to a binary one when a match is found between the contents of a select location of the CAM block corresponding to the age_cell and an externally supplied search data. The memory system also includes reset circuitry provided with each age_cell to clear the age_cell during a read operation with respect to the age_cell. Preferably, the reset circuitry is operable in response to a reset control signal generated to indicate that the read operation is substantially complete.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
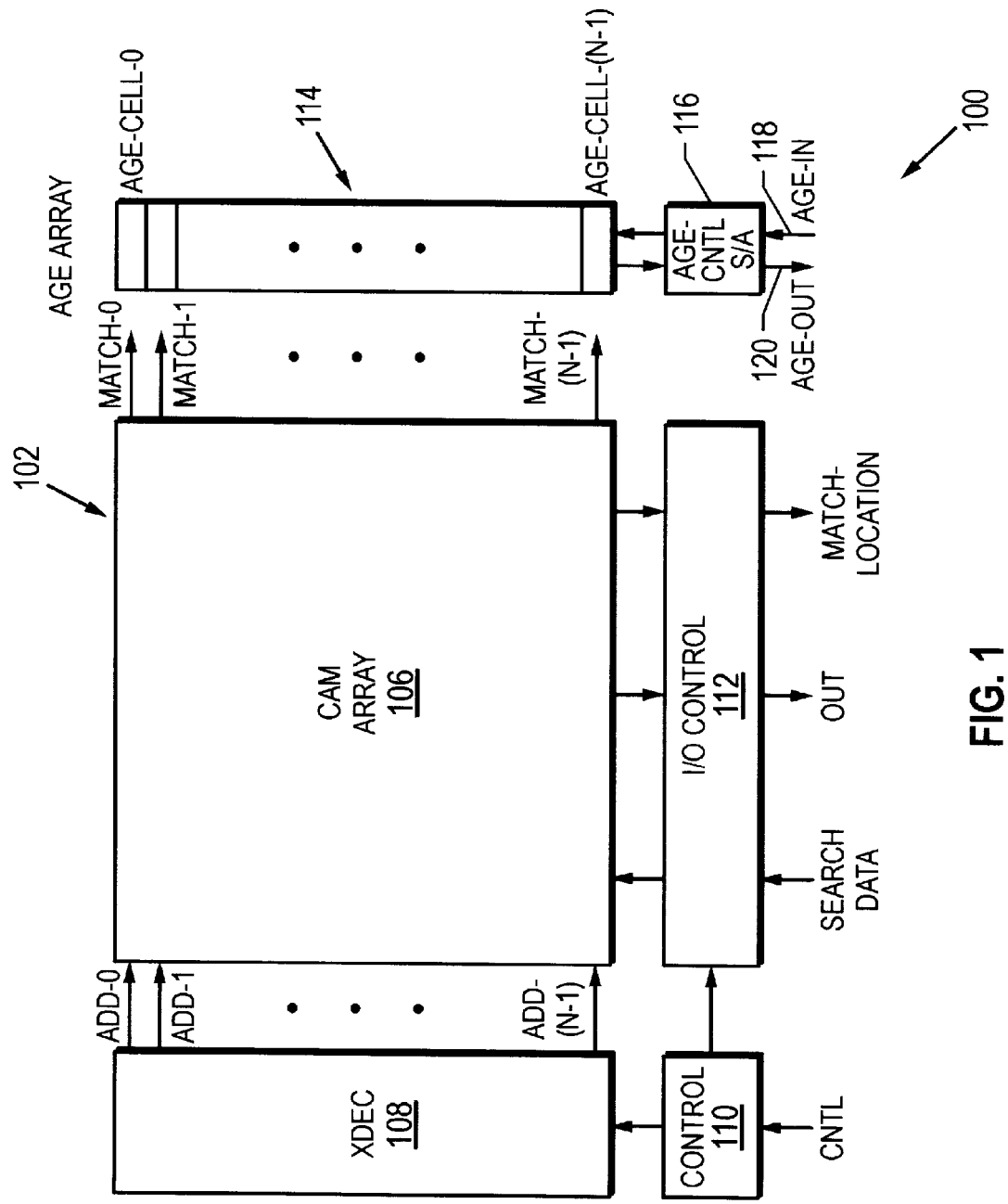
FIG. 1 depicts an exemplary embodiment of a CAM usage management system wherein the teachings of the present invention may be advantageously practiced.

In the drawings, like or similar elements are designated with identical reference numerals throughout the several views thereof, and the various elements depicted are not necessarily drawn to scale. Referring now to FIG. 1, depicted therein is a physical architectural view of a presently preferred exemplary embodiment of a CAM usage management system 100 wherein the teachings of the teachings of the present invention may be advantageously practiced. An exemplary CAM block 102 includes a CAM array 106 organized as N locations, each location preferably comprising a select width, e.g., a word. A CAM control block 110 is provided to direct an X-Decoder (XDEC) block 108 for generating appropriate row address signals (ADD-0 through ADD-(N-1)) with respect to the N CAM locations. As is well known, the array of CAM locations is addressed by providing a data value (i.e., search data) to each column of CAM cells via a suitable input/output (I/O) control block 112. The CAM cells may be comprised of conventional twelve-transistor (12-T) or nine-transistor (9-T) cells (each cell being a static random access memory (SRAM) cell coupled to an exclusive-OR (XOR) gate) (not specifically shown in this FIG.). Typically, complementary data values are also provided to the CAM columns. If the data value stored in a row of the CAM cells (i.e., a location) matches the applied search data, then a match condition occurs, whereupon a Match signal corresponding to the CAM location is asserted high. On the other hand, the Match signal would be driven low if there was no match condition between the contents of the location and the externally applied search data. Accordingly, the CAM memory management system 100 provides a plurality of Match signals (Match-0 through Match-(N-1)) that correspond to the N locations of CAM array 106 for determining whether or not the data of a location has changed since its storage thereat.

For example, once the CAM array 106 is initialized, data can be searched through the entire CAM in a single search operation. If there is any match, the array can generate the address of the location (Match_Location) where the search data matches with the stored data. For maximum utilization of the CAM array and improved system performance, the array may be checked periodically whether the contents of the locations have changed since the previous check. If any location of the CAM array 106 is not used for valid data storage since the previous check (i.e., the contents of that location have changed and the corresponding Match signal is accordingly driven low during the search cycle), the location can be updated with new data.

In a presently preferred exemplary embodiment of the CAM usage management system 100, a separate memory 114 (referred to as an age_array) is provided for monitoring the CAM array usage. Age_array 114 is comprised of a plurality of cells (referred to as age_cells, Age Cell_0 through Age_Cell_N-1)) organized as an N-by-1 unidimensional array, wherein each cell corresponds to a particular location of the CAM array 106 and is set by the Match signal associated therewith. A control/sense amp (SA) block 116 is provided for age_array control and read operations with respect thereto. A control signal, Age_In 118, is applied as an input to the control/SA block 116 for effectuating the selection of a wordline (not shown in this FIG.) for a particular age_cell. In an exemplary embodiment, a counter (age_counter) initialized with the size of the age_ array 114 may be employed to generate at least a part of such control signal. An Age_Out signal 120 is available for outputting data read from a selected age_cell during a read operation with respect thereto.

Essentially, the functionality of the age_cells is to monitor if and when the CAM locations are available for new data storage. After initializing the age_cells to 1, the age_array 114 is read (from one end to the other, using the age_ counter, for example). Upon reading each age_cell, it is reset to 0. During a search cycle of the CAM array 106, if a match condition is found with respect to a location, the corresponding age_cell is set to 1. Accordingly, when the age_array is 114 read again and the value of an age_cell is 0, it means that the particular age_cell has not been set to 1 by its Match signal during the CAM array search cycle. That is, the corresponding CAM location contains data that is no longer in use and, therefore, the location can be used for storing new data.

As pointed out in the Background section of the present patent application, conventional resetting of the age_array cells employs a separate write cycle following the read cycle for storing a binary 0 at a particular age_cell, which is wastefull of memory cycles and system resources.

Figure 2A:
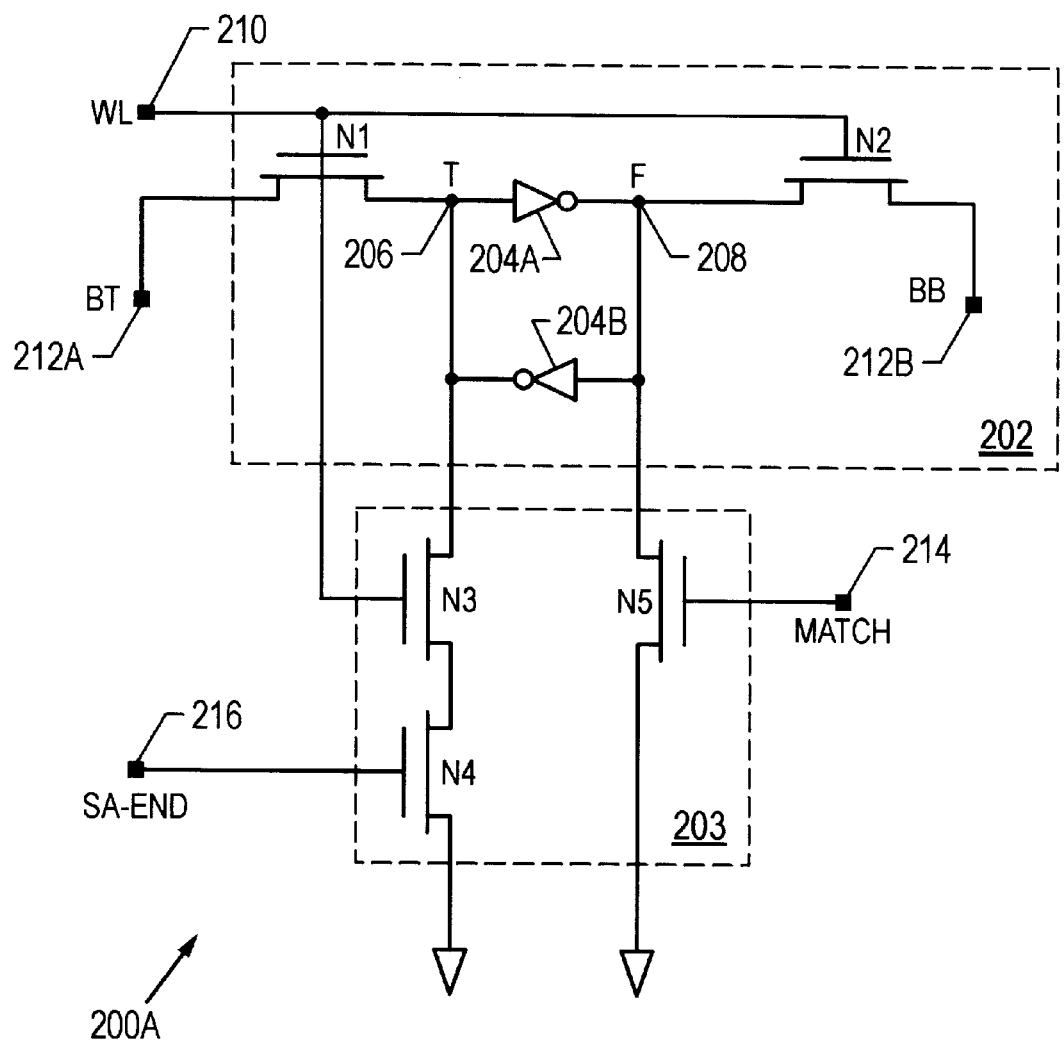
FIG. 2A depicts a presently preferred exemplary embodiment of a memory storage cell including reset circuitry provided in accordance with the teachings of the present invention.

FIG. 2A depicts a presently preferred exemplary embodiment of a memory storage cell 200A (such as an age_cell set forth hereinabove) including reset circuitry provided in accordance with the teachings of the present invention for storing a binary 0 without a separate write cycle. The memory storage cell 200A includes a storage portion 202 comprised of an SRAM cell (e.g., 6-T cell) that can be read using a WL 210 associated therewith. Access transistors N1 and N2 are coupled to data (TRUE or T) and data bar (FALSE or F) nodes (reference numerals 206 and 208, respectively) formed at the termini of a coupled inverter pair that is comprised of inverters 204A and 204B. Bitline (BT) 212A and bitline bar (BB) 212B are coupled to the data and data bar nodes via access transistors N1 and N2, respectively. Those skilled in the art should readily appreciate that the pair of bitline and bitline bar signals may be conventionally provided to a sense amp circuit for purposes of sensing data using well known techniques in the memory design art.

A set/reset circuitry portion 203 is preferably provided as part of the memory storage cell 200A for achieving combined setting and resetting functionality with respect to the storage portion 202 in accordance with the teachings of the present invention. Transistors N3 and N4 are coupled in series to the data node 206, whereas transistor N5 is coupled to the data bar node 208. In the exemplary embodiment shown in FIG. 2, transistors N3, N4 and N5 are provided as n-channel MOS (NMOS) devices, wherein N3 may be referred to as the discharge device, N4 may be referred to as the pull-down device and N5 may be referred to as the set device for the sake of convenience.

The WL signal 210 associated with the memory storage cell 200A is provided to the gates of access transistors N1 and N2 as well as the gate of transistor N3. A Match signal 214 which corresponds to a particular CAM location (as described in detail hereinabove) is provided to the gate of transistor N5. A reset control signal 216, referred to as SA_END, is provided to the gate of transistor N4. The functionality of these various signals in effectuating the combined set/reset functionality is set forth hereinbelow.

During a CAM search cycle, WL 210 and SA_END 216 are inactive and Match signal 214 is driven high, provided a match condition is detected with respect to the corresponding CAM location. Accordingly, the set device N5 is turned on and the data bar node 208 is pulled to ground. Thus, a binary value of 1 is stored at the data node 206 of the storage cell portion 202.

During a read operation with respect to the memory storage cell 200A, address is decoded appropriately and WL 210 is driven high. As access transistors N1 and N2 are turned on, a voltage differential or separation is developed between BT 212A and BB 212B in accordance with the binary values of 1 and 0 present at the data and data bar nodes, respectively. A sense amp block (e.g., SA block 116 depicted in FIG. 1) senses the voltage differential and stores the data value associated therewith for subsequent data out operations. Substantially at the same time, the reset control signal 216 (i.e., SA_END) is generated and provided to the gate of the pull-down device N4, thus turning it on. As WVL 210 is still being driven high, the discharge device N3 is also on, thereby discharging the data node 206 and storing a binary 0 thereat.

In a presently preferred exemplary embodiment of the present invention, SA_END 216 is also provided to the address control block to deactivate the WL signal to complete the read cycle. The data value sensed by the SA is in the meantime outputted normally for subsequent operations.

Figure 2B:
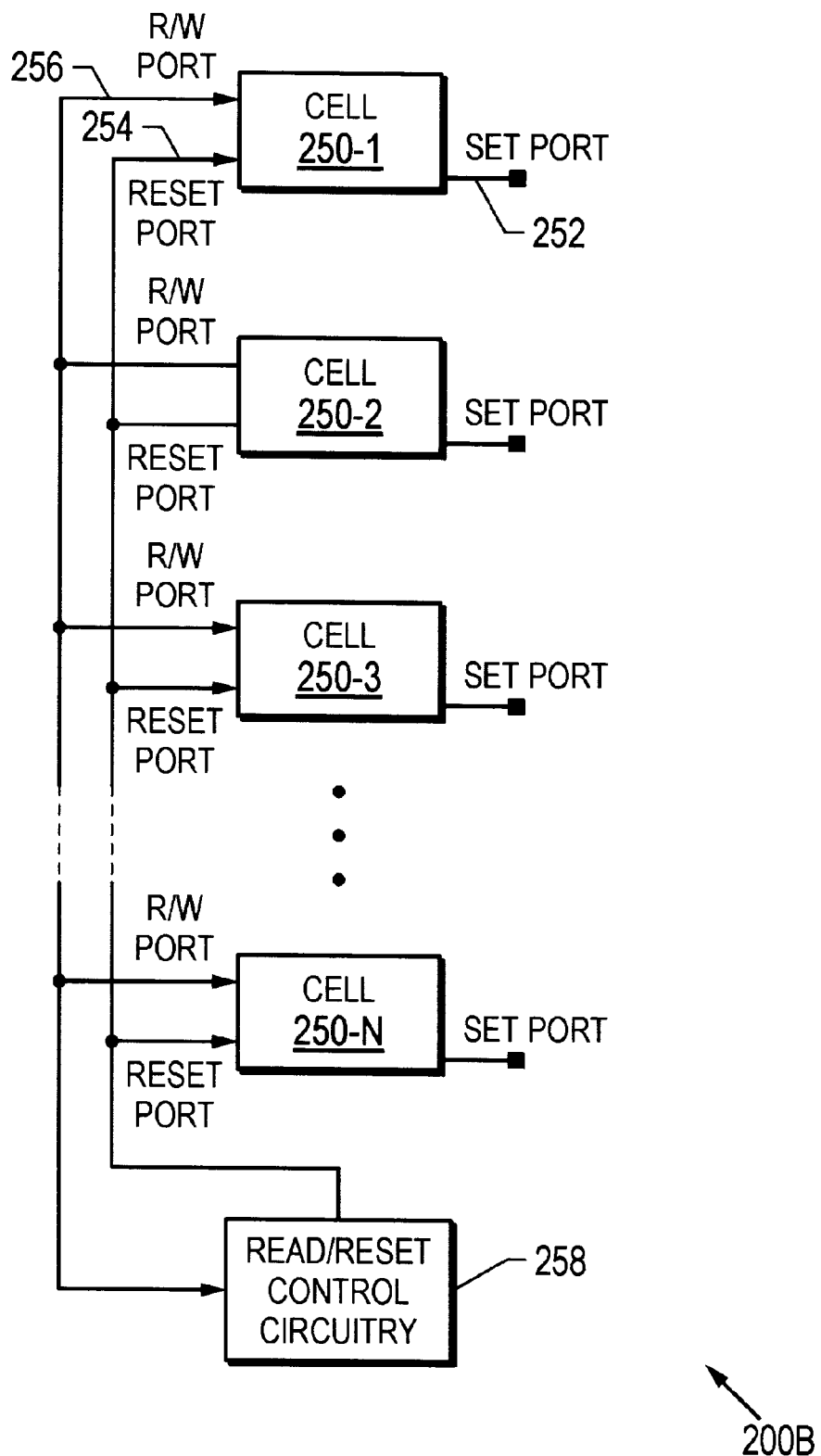
FIG. 2B depicts an exemplary semiconductor memory circuit embodiment including a plurality of memory storage cells of the present invention.

FIG. 2B depicts an exemplary embodiment of a semiconductor memory circuit 200B comprising N memory storage cells (reference numerals 250-1 through 250-N), each of which is preferably formed such as the memory storage cell 200A described in detail hereinabove. Those skilled in the art should recognize upon reference hereto that the semiconductor memory circuit 200B may preferably be operable as the age_array 114 shown in FIG. 1.

Each storage cell, e.g., cell 250-1, is comprised of a set port 252, a reset port 254, and a read/write port 256. A main read/reset control circuitry 258 is provided for controlling read/write operations and reset operations with respect to the storage cell functionality as elucidated hereinabove. The read/write port 256 is operable with WL and Data In signals to sense data from and write data into the cell, respectively. The reset port 254, which is preferably activated only for the WL selected for a read operation with respect to a specific storage cell, is operable with a reset control signal (i.e, SA_END) for resetting the selected storage cell. Furthermore, as pointed out hereinbefore, the reset control signal is also operable to deactivate the selected WL, wherein the reset path to the storage cell is faster than the reset path to the selected WL. When operable as an age_array to monitor the usage of a CAM block, the set port 252 of the memory storage cells (each of N rows having a set port) is preferably activatable by a Match signal emanating therefrom.

Figure 3:
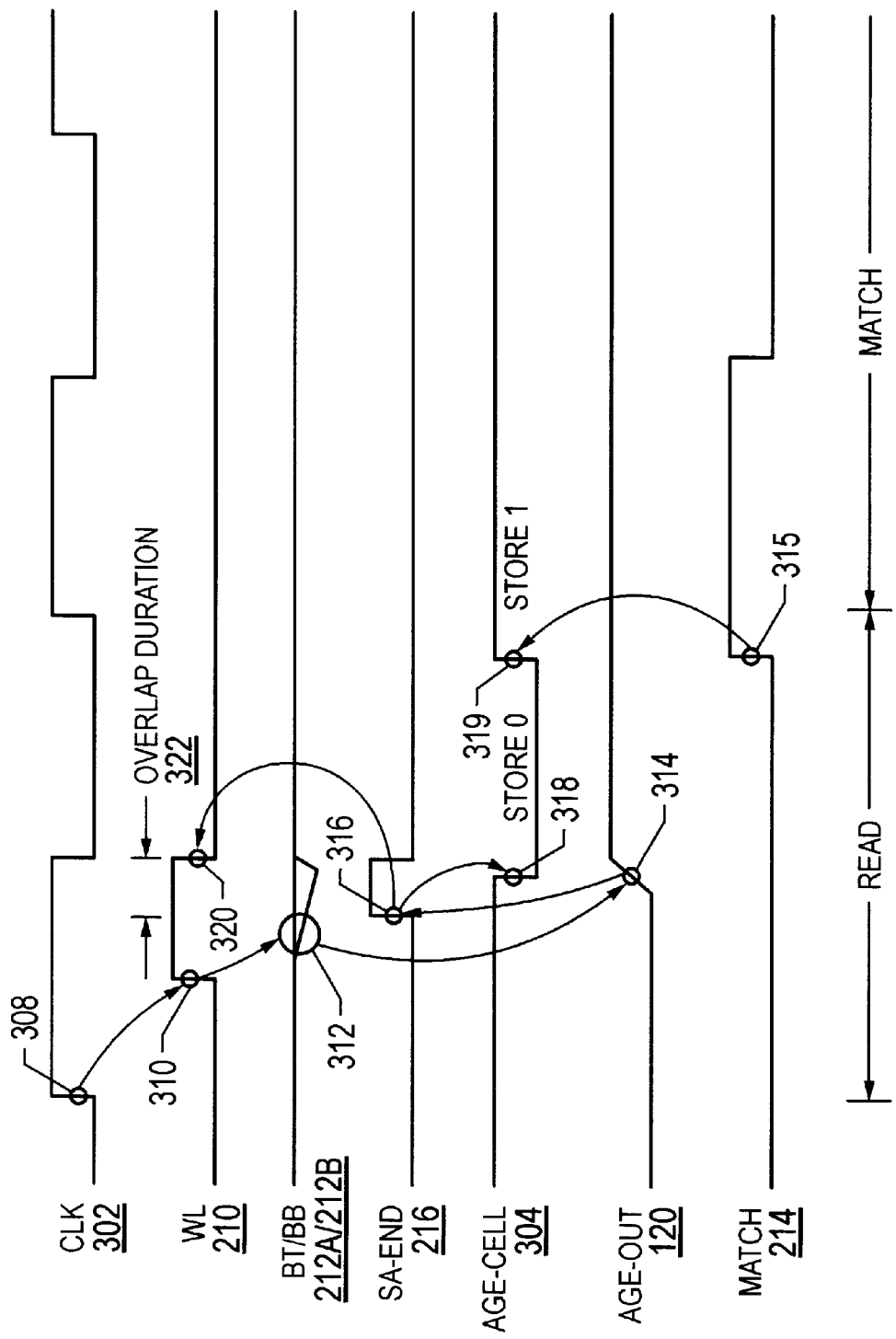
FIG. 3 depicts a timing diagram for a read cycle which allows storage of a binary 0 in the memory cell being read without a write cycle.

Referring now to FIG. 3, depicted therein is a timing diagram for the set/read/reset operations set forth above as exemplified with respect to the memory storage cell (or age cell) provided in accordance with the teachings of the present invention. As alluded to before, during the CAM search, WL and SA_END are inactive and Match 214 is driven high (exemplified by a rising edge 315). Data in the age_cell, which is exemplified by AGE_CELL 304, is set to 1 in response to the rising edge of the Match signal, as indicated by a rising edge 319 in AGE_CELL 304.

Upon asserting a clock (CLK) signal 302 to indicate a read cycle (rising edge 308 in CLK), WL 210 is driven high (rising edge 310) responsive thereto. The development of a voltage separation between BT and BB lines is exemplified by differential voltage 312. In response, Age_Out 120 is driven high (rising edge 314) to output the sensed data. Substantially at the same time, SA_END 216 is asserted high (rising edge 316) which overlaps with the duration 322 when WL 210 is also high. Responsive to the rising edge 316 in SA_END 216, VWL is deactivated (falling edge 320) and the data node is discharged as described in detail hereinabove. AGE_CELL 304 is accordingly driven low (exemplified by falling edge 318) to indicate storing of a binary 0.

Figure 4:
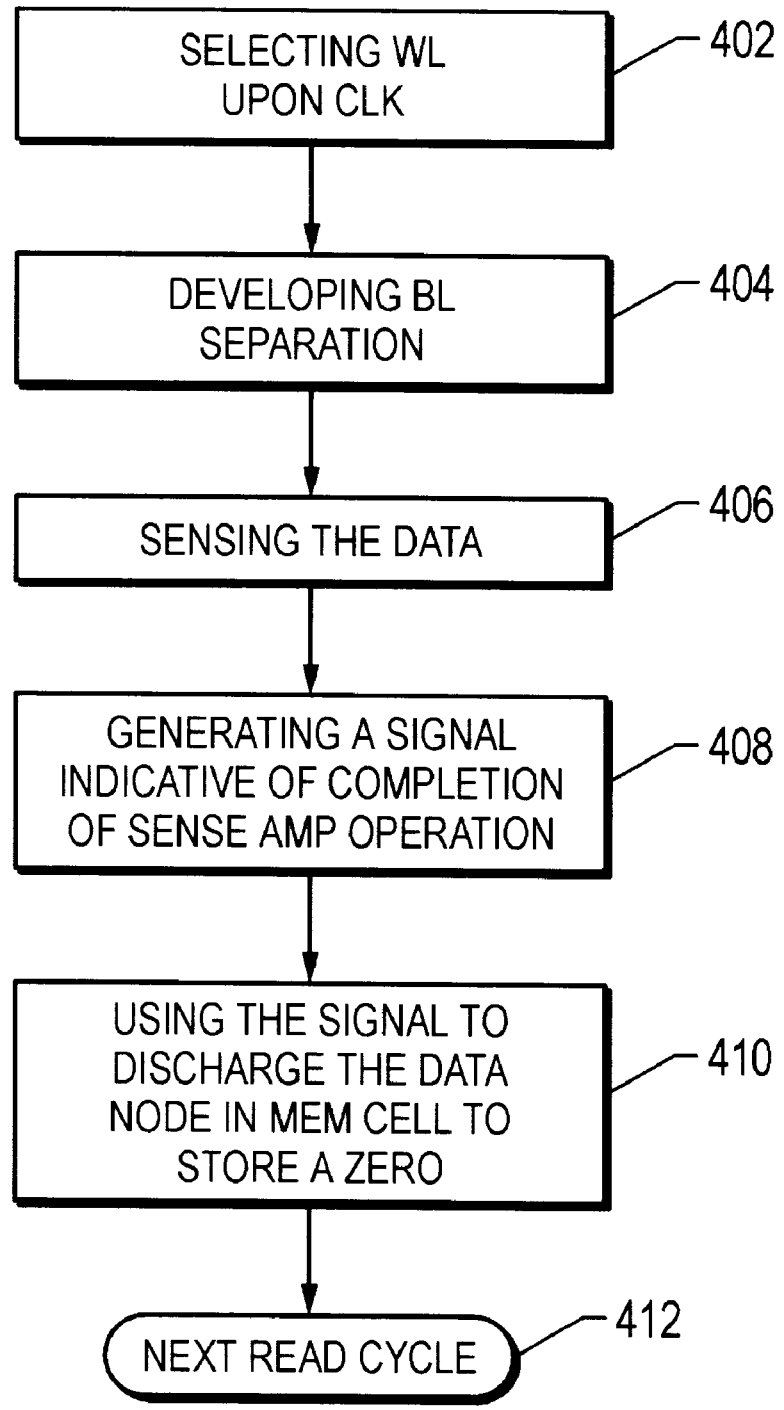
FIG. 4 is a flow chart of the various steps involved in an exemplary memory cell reset operation in accordance with the teachings of the present invention.

FIG. 4 is a flow chart of summarizing the various steps involved in the exemplary memory storage cell reset operation set forth above in accordance with the teachings of the present invention. Upon asserting the CLK signal, a WL is selected (step 402) to initiate the read operation. Bitline separation is developed pursuant to the stored data value in the storage cell (step 404), which is subsequently sensed by SA circuitry (step 406). During or upon substantial completion of the sensing operation, a reset control signal indicative of the sensing operation condition is generated (step 408) and applied in accordance with the teachings herein in order to discharge the stored data. A binary 0 is therefore stored thereat without a dedicated write cycle therefor (step 410). This sequence of "built-in read/write" operations continues to take place thereafter for the next read cycle (step 412).

Based on the foregoing, it should be appreciated that the present invention provides a simple yet effective solution for advantageously eliminating dedicated write cycles in order to reset a memory. In addition to reducing memory cycles, the present invention optimizes memory usage and system resources in a demanding application such as, e.g., network processors in routers, etc. Furthermore, those skilled in the art should readily recognize upon reference hereto that the present invention is particularly advantageous with respect to more expensive memory such as CAM.

It is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims. For example, although the presently preferred exemplary embodiment of the present invention has been described in conjunction with a CAM array, it should be realized that the read/reset scheme of the present invention may be practiced with other memory types. Further, although SRAM cells have been described to exemplify the teachings of the present invention, various other cells may be employed in the practice hereof. Additionally, the use of NMOS devices in the reset control circuitry is illustrative rather than restrictive. Various combinations of PMOS and NMOS devices, in assorted logic arrangements, may be implemented to achieve the reset functionality of the present invention. Accordingly, it should be clearly understood that these and other numerous variations, substitutions, additions, re-arrangements, extensions, and modifications are contemplated to be within the ambit of the present invention whose scope is solely limited by the claims set forth below.

What is claimed is:

1. A semiconductor memory circuit, comprising:
   a column of storage cells arranged in N rows, each of said storage cells comprising a read/write port, a set port, and a reset port, said set port for setting a first data value in a particular storage cell; and
   read/reset control circuitry coupled to said column of storage cells, said read/reset control circuitry for providing at least a reset control signal to said storage cells for resetting, said reset control signal controlling said reset port to reset said particular storage cell to a second data value, without a separate write cycle, upon reading said first data value from said particular storage cell.

2. The semiconductor memory circuit as set forth in claim 1, wherein said set port is provided for each row and is operable to receive a Match signal from a Content Addressable Memory (CAM) associated with said semiconductor memory circuit.

3. The semiconductor memory circuit as set forth in claim 2, wherein said reset port is activated only for a particular storage cell selected for a read operation.

4. The semiconductor memory circuit as set forth in claim 3, wherein said read operation is effectuated by a selected wordline in said column of storage cells.

5. The semiconductor memory circuit as set forth in claim 4, wherein said reset control signal is further operable to deactivate said selected wordline.

6. The semiconductor memory circuit as set forth in claim 5, wherein reset path to said particular storage cell is faster than reset path to said selected wordline such that said particular storage cell is reset prior to deactivating said selected wordline.

7. The semiconductor memory circuit as set forth in claim 6, wherein each storage cell includes a data node and a data bar node.

8. The semiconductor memory circuit as set forth in claim 7, wherein each storage cell further includes:
- a pair of coupled inverters disposed between said data and data bar nodes;
- each of said data and data bar nodes being accessible via an access transistor actuated by a wordline associated with said storage cell, wherein said data node is accessed by a BT line and said data bar node is accessed by a BB line;
- first and second/transistors coupled to said data node in series, wherein said first transistor is operable to be driven by said wordline and said second transistor is operable to be driven by said reset control signal; and
- a third transistor coupled to said data bar node, wherein said third transistor is operable to be driven by said Match signal.

9. A semiconductor memory circuit, comprising:
- a plurality of storage cells, each having a data node and a data bar node; and
- circuitry coupled to at least one storage cell for resetting a binary 0 at said data node associated therewith, without a separate write cycle, upon substantial completion of a read cycle operation with respect to said at least one storage cell.

10. The semiconductor memory circuit as set forth in claim 9, wherein said storage cells comprise static random access memory (SRAM) cells.

11. The semiconductor memory circuit as set forth in claim 10, wherein said circuitry comprises first and second transistors coupled in series to said data node, wherein said first transistor is operable to be driven by a wordline associated with said at least one storage cell and said second transistor is operable to be driven by a reset control signal indicating that said read operation is substantially complete.

12. The semiconductor memory circuit as set forth in claim 11, further comprising a third transistor coupled to said data bar node, wherein said third transistor is operable to be driven by a Match signal emanating from a Content Addressable Memory (CAM) block.

13. The semiconductor memory circuit as set forth in claim 12, wherein each of said first, second, and third transistors comprises an n-channel Metal Oxide Semiconductor (NMOS) device.

14. The semiconductor memory circuit as set forth in claim 12, wherein said circuitry is coupled to each of said storage cells.

15. The semiconductor memory circuit as set forth in claim 12, wherein each of said SRAM cells comprises a 6-T cell.

16. The semiconductor memory circuit as set forth in claim 12, wherein said reset control signal indicating that said read operation is substantially complete is operable to deactivate said wordline associated with said at least one storage cell.

17. A memory system, comprising:
- a Content Addressable Memory (CAM) block including a plurality of locations operable to store a plurality of contents thereat;
- an age_array operably associated with said CAM block for monitoring said plurality of locations to determine whether a particular location of said CAM block is available for storing new content data thereat, said age_array comprising a plurality of age_cells, each corresponding to a specific location in said CAM block;
- set means provided with each age_cell to store a binary 1 in said age_cell when a select location of said CAM block corresponding to said age_cell includes contents that match an externally supplied search data; and
- reset means provided with each age_cell to clear said age_cell during a read operation with respect to said age_cell, said means operating in response to at least a reset control, signal generated to indicate that said read operation is substantially complete.

18. The memory system as set forth in claim 17, wherein each of said plurality of locations comprises a plurality of static random access memory (SRAM) cells.

19. The memory system as set forth in claim 17, wherein each age_cell comprises a 6-T SRAM cell including data and data bar nodes.

20. The memory system as set forth in claim 19, wherein said set means comprises a pull-down transistor coupled to said data bar node, said pull-down transistor operating to drive said data bar node to ground responsive to a Match signal indicating that said select location of said CAM block corresponding to said age_cell includes contents that match said externally supplied search data.

21. The memory system as set forth in claim 20, wherein said reset means comprises first and second transistors coupled in series to said data node, said first and second transistors operating to drive said data node to ground upon application said reset control signal, wherein said first transistor is operable to be driven by a wordline associated with said age_cell and said second transistor is operable to be driven by said reset control signal.

22. A method of resetting a memory storage cell without a write cycle, comprising the steps of:
- upon application of a clock signal to initiate a read cycle with respect to said memory storage cell, activating a wordline associated with said memory storage cell;
- developing a voltage separation between data and data bar nodes associated with said memory storage cell, said voltage separation being indicative of a binary data value stored thereat;
- sensing said binary data value on bit and bit bar lines coupled to said data and data bar nodes, respectively, and thereby generating a data out signal;

generating a reset control signal indicating that said sensing step is substantially complete; and applying said reset control signal to said memory storage cell's data node in order to store a binary 0 thereat without a separate write cycle.

23. The method of resetting a memory storage cell without a write cycle as set forth in claim 22, further comprising the step of deactivating said wordline associated with said memory storage cell responsive to said reset control signal.

24. The method of resetting a memory storage cell without a write cycle as set forth in claim 23, wherein said wordline is operable to drive a first transistor and said reset control signal is operable to drive a second transistor, said first and second transistors operating in tandem to drive said data node to ground when said wordline and said reset control signal are applied.

25. The method of resetting a memory storage cell without a write cycle as set forth in claim 24, wherein said sensing step is effectuated by a differential sense amplifier.

26. The method of resetting a memory storage cell without a write cycle as set forth in claim 24, wherein said binary data value is a binary 1.

27. The method of resetting a memory storage cell without a write cycle as set forth in claim 24, said first and second transistors comprise n-channel Metal Oxide Semiconductor (NMOS) devices.

* * * * *